(12) United States Patent
Southwell

(10) Patent No.: US 6,400,513 B1
(45) Date of Patent: Jun. 4, 2002

(54) OPTICAL BEAM COUPLING OF MULTIPLE WAVELENGTHS INTO AN OUTPUT CHANNEL USING SPATIAL WAVEFRONT SEGMENTATION

(75) Inventor: William H. Southwell, Thousand Oaks, CA (US)

(73) Assignee: Quantum Devices, Inc., Yorba Linda, CA (US)

(*) Notice: Subject to any disclaimer, the term of this patent is extended or adjusted under 35 U.S.C. 154(b) by 0 days.

(21) Appl. No.: 09/525,516

(22) Filed: Mar. 15, 2000

(51) Int. Cl.[7] .................. G02B 27/30; G02B 27/10; G02B 6/26; H01S 3/08
(52) U.S. Cl. .................. 359/641; 359/618; 359/619; 359/630; 359/719; 385/24; 385/36; 385/46; 385/123; 372/69; 372/71; 372/101
(58) Field of Search .................. 359/641, 618, 359/619, 630, 625, 621, 622, 710, 719, 121, 124; 385/24, 31, 33, 36, 46, 123; 372/69, 71, 101

(56) References Cited

U.S. PATENT DOCUMENTS

| | | | | |
|---|---|---|---|---|
| 5,077,728 A | | 12/1991 | Kaminow | 359/124 |
| 5,333,077 A | * | 7/1994 | Legar et al. | 359/619 |
| 5,369,661 A | * | 11/1994 | Yamaguchi et al. | 372/69 |
| 5,394,489 A | | 2/1995 | Koch | 385/14 |
| 5,418,880 A | * | 5/1995 | Lewis et al. | 385/123 |
| 5,541,951 A | * | 7/1996 | Juhasz et al. | 372/101 |
| 5,592,333 A | * | 1/1997 | Lewis | 359/619 |
| 5,787,107 A | | 7/1998 | Leger et al. | 372/71 |
| 5,790,729 A | | 8/1998 | Pologe et al. | 385/46 |
| 5,808,803 A | * | 9/1998 | Ullmann et al. | 359/641 |
| 5,926,299 A | | 7/1999 | Bayart et al. | 359/121 |
| 6,005,717 A | * | 12/1999 | Neuberger et al. | 359/619 |
| 6,215,598 B1 | * | 4/2001 | Hwu | 359/641 |

OTHER PUBLICATIONS

James R. Leger et al., "Geometrical Transformation of Linear Diode–Laser Arrays for Longitudinal Pumping of Solid–State Lasers", IEEE Journal of Quantum Electronics, vol. 28, No. 4, Apr. 1992; pp. 1088–1100.

L.A. Wang et al., "Tolerance Analysis of Aligning an Astigmatic Laser Diode with a Single–Mode Optical Fiber", Journal of Lightwave Technology, vol. 14, No. 12, Dec. 1996; pp. 2757–2762.

* cited by examiner

Primary Examiner—Loha Ben
(74) Attorney, Agent, or Firm—Volentine Francas, PLLC

(57) ABSTRACT

An apparatus and method for coupling an array of light beams extending predominantly in one direction into an output port. The light beams are rearranged into a desired shape which extends more equally along two directions than does incident array of light beams. The operation of the rearranging is wavelength insensitive. The rearranged light beams are focused onto the output port. For output ports having a small interface, the focal length of a lens focusing the rearranged light beams to the output port should be as short as possible.

26 Claims, 8 Drawing Sheets

OPTICAL BEAM COUPLING OF MULTIPLE WAVELENGTHS INTO AN OUTPUT CHANNEL USING SPATIAL WAVEFRONT SEGMENTATION

BACKGROUND OF THE INVENTION

1. Field of the Invention

This invention relates to coupling any one or many wavelengths into an optical output port, and in particular, to combining plural multi-wavelength laser beams into a single mode fiber.

2. Description of Related Art

When a plurality of light sources is to be connected to fewer optical ports, the mechanical interconnection and alignment of the optical elements become increasingly difficult with an increase in the number of light sources and/or a decrease in a number of optical output ports. The physical dimensions of the light-emitting devices limit the spacing of beams produced by the light-emitting devices such that physically juxtaposing the light-emitting devices would result in the light beams being produced in an area that is larger than the optical cross-section of an optical fiber that can practically be used to implement the optical output port.

Thus, the problem of interconnecting a plurality of light beams produced by a plurality of light-emitting devices is reduced to the need to direct the plurality of light beams into an area that is less than or equal to the optical cross-section of the optical output channel. A passive star coupler, which operates on the concept of interference or wavefront division, can be used to provide this interconnection. However, the average power at each of the output ports of the star is equal to only 1/N of the incident power of that channel, where N is the number of beams being combined. This loss is due to splitting which may not be efficiently recovered by an amplifier at either the input port or output port unless the saturation power of the amplifier is increased to be substantially N times the value of the power transmitted, which degrades the signal-to-noise ratio.

Another way to combine light beams into one optical output port is in a free space fashion using narrow bandpass optical filters or using diffractive elements. Such filters and diffractive elements do not have the 1/N loss inherent in the star coupler approach. Rather, the power of each laser with its own wavelength is combined in an additive fashion to be transmitted in a single fiber. However, more recent systems use multi-wavelength laser arrays, in which each laser may be wavelength tuned. This tunability brings wavelength agility to the systems, providing redundancy and error protection. However, when each light source can output multiple wavelengths, rather than just one specified wavelength, neither optical filters nor diffractive elements, which are both highly wavelength dependent, can be used for combining. In other words, the optical filter or diffractive element which is suitable for one wavelength is not suitable for other wavelengths. This would seemingly force the use of the star couplers with their inherent loss and subsequent need for optical amplifiers as the only method for coupling multiple wavelength beams at a useable power level.

Another method for coupling an array of light sources into a single fiber includes steering laser beams to a single focusing lens. This steering brings the light beams closer together. However, in current applications of steering, all the light sources are to have the same stable output and the coupling is merely for increasing the optical power, not for any type of multiplexing. Further, the light sources used are extremely collimated gas lasers, not presenting the difficulties of the highly divergent semiconductor light sources. Finally, the array of light beams output to the lens has the same configuration as the array of light sources, making its application for large linear arrays preferred in multiplexing applications impractical.

SUMMARY OF THE PRESENT INVENTION

The present invention is therefore directed to combining an array of light sources, the light sources having different wavelengths from one another and/or the light sources having variable wavelengths, into an optical output port which substantially overcomes one or more of the problems due to the limitations and disadvantages of the related art.

These and other advantages may be realized in accordance with the present invention by using a free space propagation approach which does not have the inherent 1/N loss of the integrated star couplers. The free space propagation approach of the present invention uses spatial wavefront segmentation rather than wavefront splitting used by the beamsplitters. This allows any light beams at any wavelength to be combined uniformly into a single fiber. Further, it is an object of the present invention to create such a free space propagation system which is wavelength insensitive.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

Figure 1:
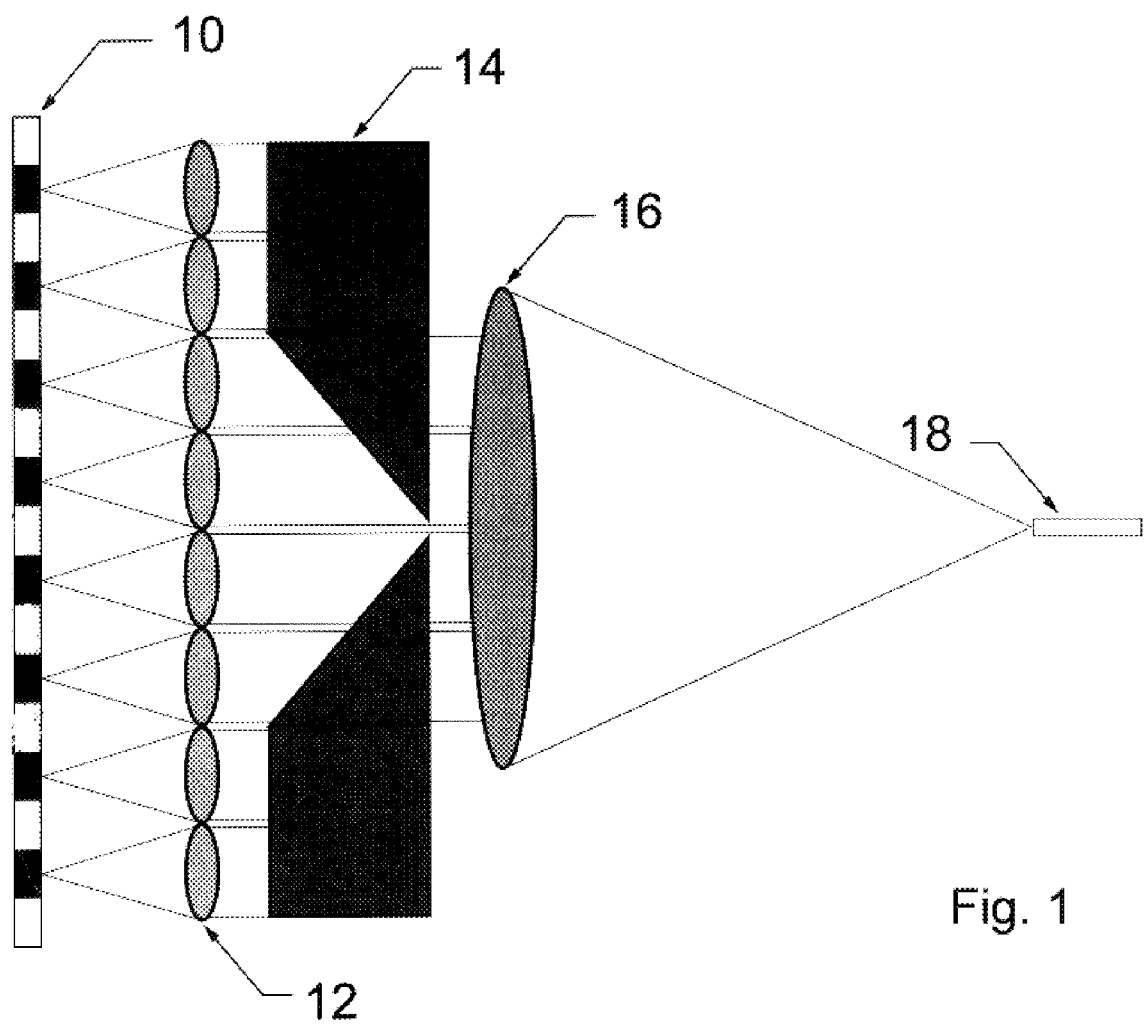
FIG. 1 is a schematic top view of the system of the present invention.

Generally, in accordance with the present invention, light from an array of lasers is collimated by a lens array and received by an array of right angle prisms. The prisms compactly reposition the beams to form a bundle which more closely matches the core shape of the fiber, typically circular. The bundle has a maximum dimension, typically a diameter, which is smaller than the largest dimension, typically length, of the laser array. This composite beam is then focused onto a single mode fiber using a lens with an f/number that matches that of the single mode fiber. A collimating lens and a focusing lens form a magnifying optical system that superimposes images of the laser output facets onto the fiber face. The light bundle at the focusing lens consists of a collection of beams from the various lasers spatially positioned together. Hence, the process in accordance with the present invention is an incoherent spatial wavefront segmentation, as opposed a wavefront division. Spatial wavefront segmentation does not have the strict 1/N loss, where N is the number of lasers being combined, inherent with the wavefront division approaches.

Losses for spatial wavefront segmentation occur when the size of the re-imaged laser facets is greater than the fiber core. The magnification of the facet image is given by the ratio of the focal lengths of the focusing lens to the collimating lens, $M=F_{focusing}/F_{collimating}$. Reducing M, which is accomplished by making the focal length of the focusing lens as short as possible, minimizes loss. For a fixed numerical aperture focusing lens, which is matched to the numerical aperture, NA, of the fiber, reducing the diameter of the assembled beams by the use of the prisms reduces the focal length, since $NA=Diameter/(2F_{focusing})$. Another way to reduce M is to make $F_{collimating}$, the focal length of the individual collimating lenses on the laser array, as long as possible. This focal length is limited in length by the requirement than laser beams do not overlap. Light quickly expands from small laser facets on the array. The principal plane of the collimating lens can be no further from the laser facet than the point where two adjacent laser beams begin to overlap. That distance defines the focal length of the collimating lens.

In one embodiment, a collimating lens may have two focal lengths, one for each orthogonal axis, because the laser facets are not square but rectangular, resulting in the beam output therefrom expanding with different divergence angles in these two planes. When the lasers are polarized, a polarization stage may be incorporated to double the number of lasers being combined.

The selection of the collimating stage is difficult when the light sources are highly divergent, e.g., semiconductor laser. Since the beam output by such light sources expands at different rates and angles in orthogonal directions, it is difficult to collimate the light beam. This is further complicated when the light sources are arranged in an array in which they are close together, making the collimating lens focal length short. The finite size of the light source output surface gets magnified as the light gets focused on the fiber face. This magnification is high because the focal length of the collimating lens is short. A highly magnified image of the light source output face on the fiber results in coupling loss. The collimating is especially critical when the light sources are to be supplied to a small output port, e.g., a single mode fiber.

As shown in FIG. 1, the system 1 in accordance with the present invention for combining an array of multiple wavelength lasers consists of a lenslet array 12, an array of prisms 14, and a single focusing lens 16. Additionally, the system 1 may include a polarizing beam splitter to perform a stage of polarization combining if the beams to be combined are polarized. The lenslet array 12 receives light from a corresponding array of lasers 10, the array of prisms reshapes the bundle of laser beams, and the single focusing lens 16 focuses the composite bundle to a single fiber 18.

Since the magnification of the light source output faces, and hence the coupling efficiency, is related to the ratio of the focal length of the focusing lens to the focal length of the collimating lens, the focal length of these lenses should be as similar as possible. Since increasing the focal length of the collimating lens is constrained by the close spacing of the output faces of the light sources, the focal length of the focusing lens must be decreased. In accordance with the present invention, forming a composite bundle which has a small cross-section, i.e., a cross-section which extends more equally along two directions than the array of light sources, allows the focal length of the focusing lens to be decreased, thereby reducing magnification and increasing the coupling efficiency.

Figure 2:
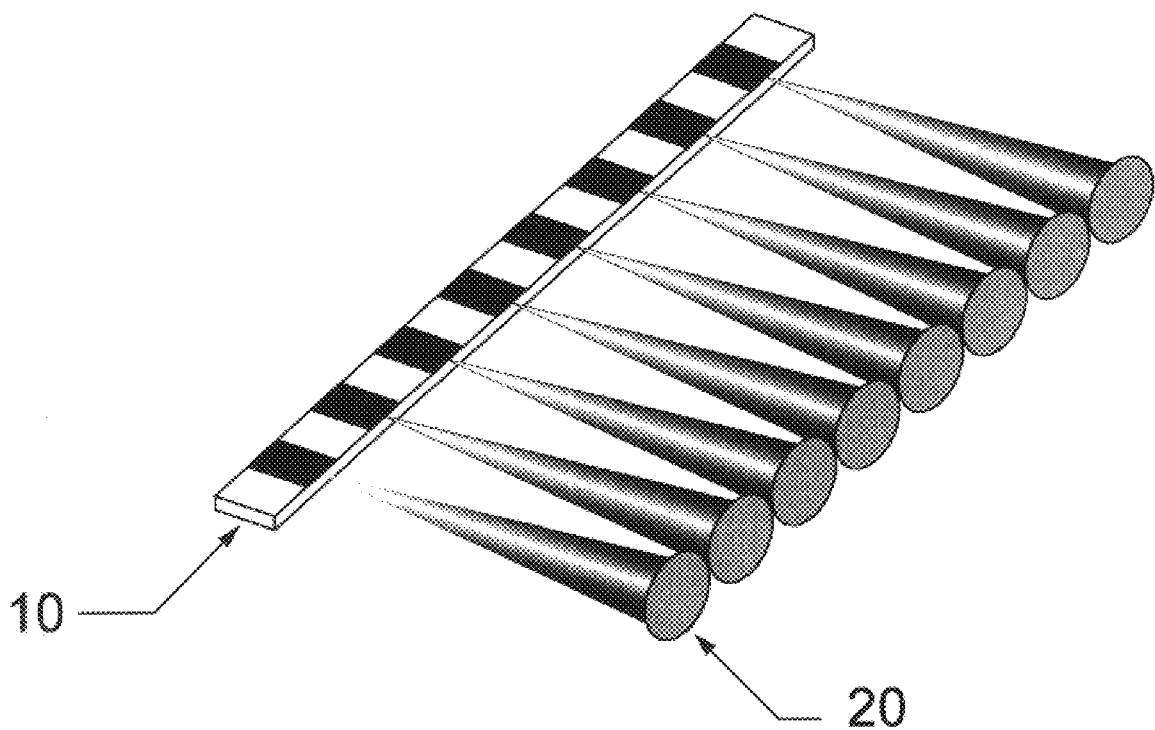
FIG. 2 is a detailed elevational side view of the laser array and the microlens array.

One embodiment of the lenslet array 12 is shown in FIG. 2. The focal length of the lenslets 20 is chosen to collimate the expanding beams at the point where they just start to overlap. The center-to-center separation of the lasers in the laser array 10 defines the aperture width of the collimating lens in that plane. Since the laser facet, i.e., the emitting surface of the laser, is usually rectangular with the long direction lying in the plane of the laser array, the beam will expand faster in the perpendicular plane. In other words, farfield beam widths are inversely proportional to the width of the near field apertures. Thus, the lens aperture in that plane needs to be larger than that defined by the laser separation in order to capture all of the power from the laser. In this embodiment, the collimating lens 20 has a single focal length and an elliptical or rectangular aperture, i.e., a shape matched to the aspect ratio of the beam.

Figure 3:
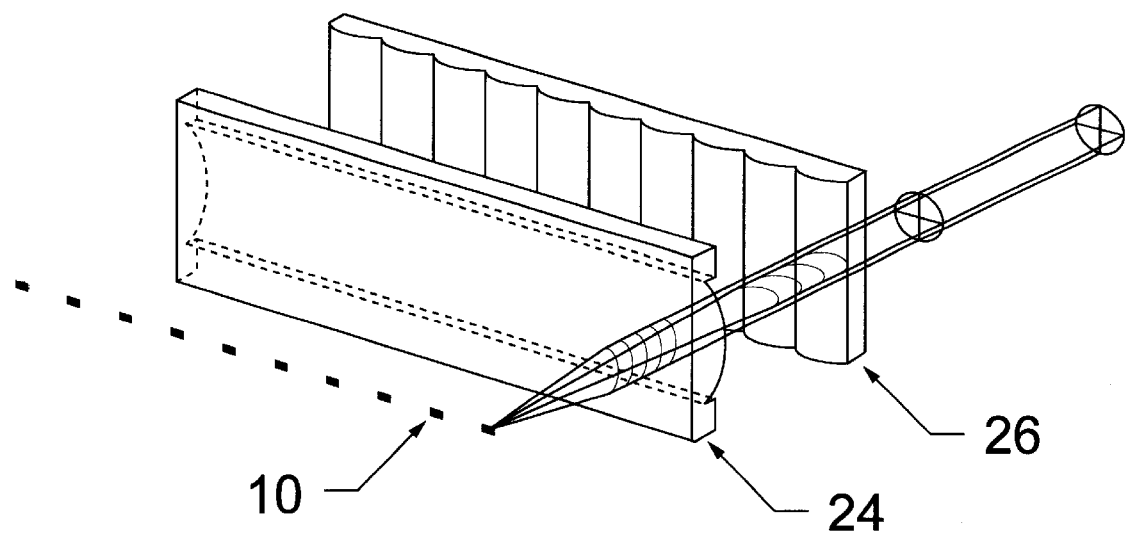
FIG. 3 is a schematic end view of FIG. 2.

Often the beam expansion in the perpendicular direction is very fast (often faster than an f/1 beam). Another embodiment of the lenslet array 12 is shown in FIG. 3, in which a dual focal length collimating lens is used. Such a dual focal length collimating lens has a shorter focal length in the perpendicular plane that captures and collimates the light at a location closer to the laser emitting facet such that the height of the collimated beam measured in the vertical plane is the same as the width measured in the horizontal plane. This results in a more nearly round beam, which makes later manipulation by the prisms easier. This may be accomplished as shown in FIG. 3 by using crossed cylindrical lenses 24, 26 separated to achieve the required output beam shape. The cylindrical lens 24 closest to the laser array 10 is for collimating the light along the fast axis, while the other cylindrical lenses 26 are for collimating the light along the slow axis. The focal length in the plane parallel to the plane of the laser array 10 is determined, as in the single focal length embodiment above, by the point where adjacent beams just begin to overlap.

Figure 4:
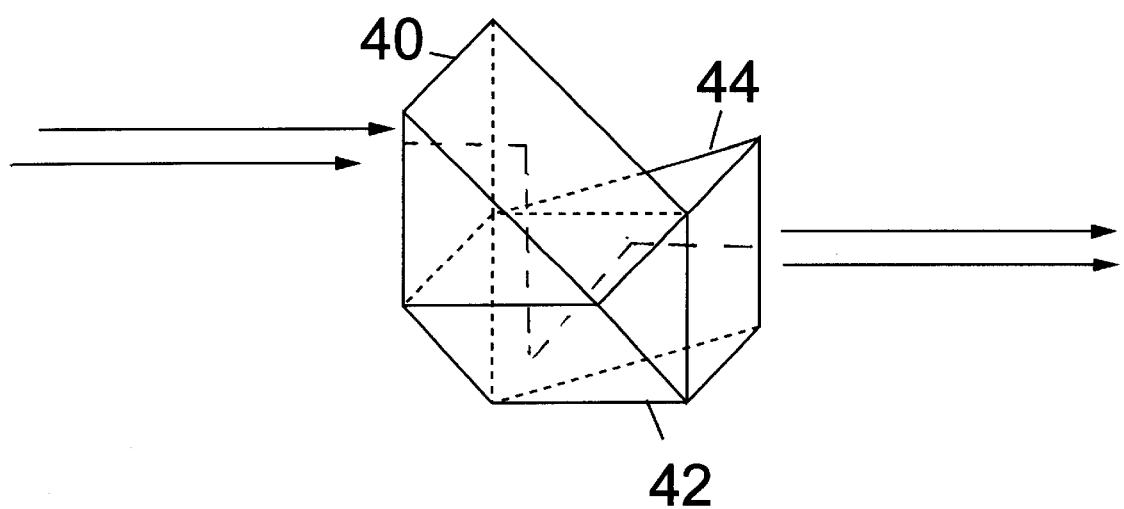
FIG. 4 is a schematic side view of the system of FIG. 1.
Figure 5:
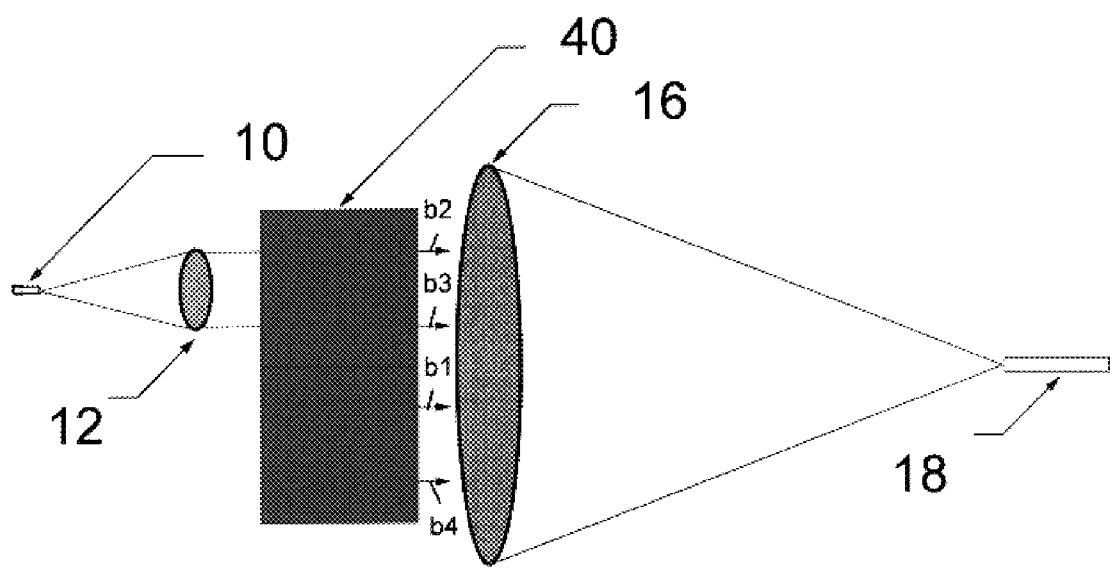
FIG. 5 is an elevational view of three right angle prisms.

Some of the collimated beams from either embodiment shown in FIGS. 2 and 3 are then incident on an array of prisms 14, as can be seen from FIG. 1. An example of the prism 14 structure used is shown in FIG. 4, in which three prisms 40, 42, 44 are arranged to deflect an input beam to a desired position. In the configuration shown in FIG. 4, the first prism 40 deflects the beams by 90° to an up or down direction. The second prism 42 then deflects the beam laterally. Finally, a third prism 44 deflects the beam forward again. The path of the beams through the three prisms is illustrated by long dashed lines, while the input and output beams are indicated by solid lines. The minimum number of reflections needed to translate a parallel beam is two, thus open-faced mirrors, e.g., coated flat surfaces, could be used for in place of the three prisms. The use of prisms has the advantage of total internal reflection and ease of alignment. Light enters and exits through the square sides of the right angle prisms and experiences total internal reflection from the prism hypotenuse. It is easy to obtain antireflection coatings on the square sides. The reason for deflecting the beams is to form a shaped array of beams which more closely resembles the core of the fiber, typically circular, to which the beams are to be input, as illustrated below in connection with FIGS. 5–7C. In other words, after deflection, the array of light beams more equally extends in two directions than the array of light sources, i.e., the array of light beams prior to deflection.

As an example, consider a linear array of four lasers with center-to-center separation of s. Each laser is collimated with a beam diameter and height of s. On one end a prism structure as shown in FIG. 4, each with a square face of width s is placed over the first beam b1 and the fourth beam b4, as shown from the side view in FIG. 5. The first prism 40 deflects beams b1 (b4) down and the second prism 42 deflects beams b1 (b4) toward a center of the beam. Finally, the third prism 44 (which is hidden in this side view) deflects the first beam b1 parallel to and just under the second beam b2, which is left undeviated. A similar set of three right angle deflections is given to the fourth beam except that the resulting fourth beam (b4) is parallel to and just under the third beam (b3), which is also left undeviated.

Thus, the shape of the composite beam has been changed from rectangular s by 4s to square 2s by 2s. The rectangular beam, in this case, needs a focusing lens 16 of diameter $(17)^{1/2}$s=4.123 s. whereas the square beam needs a focusing lens 16 of diameter $2 \times 2^{1/2}$s=2.828s. This reduces the focal length of the focusing lens 16 by a factor of 1.458, which in turn, reduces the size of the magnified image of the laser facet on the fiber face. This smaller facet image is brighter, resulting in more power being coupled to the fiber 18.

The clear aperture diameter, D, of the focusing lens 16 is such to just capture all the beams. The numerical aperture, $NA_{fiber}$, of the focusing lens 16 must match that of the fiber 18. Thus, the focal length, $F_{focusing}$, of focusing lens is, $$F_{focusing} = D/(2\ NA_{fiber}). \tag{1}$$

Each laser is assumed to have a far field semi cone angle in the horizontal plane (the plane of the laser array) described by $\theta_h$ for its $1/e^2$ beam energy point. Since the aperture diameter in the horizontal plane is s, the following relation for the focal length of the collimating lens in the horizontal plane, $$F_h = s/(2\ \tan\ \theta_h) \approx s/(2\ NA_h), \tag{2}$$

where $NA_h$ is the equivalent numerical aperture of the laser beam in the horizontal plane. Typically, lasers emit with a higher far field angle, $\theta_v$, in the vertical plane. For example, $\theta_v$ may be twice as large as $\theta_h$. The collimating lens has a single focal length (that is, the focal length in the vertical plane $f_v$ is equal to $f_h$), but a full rectangular aperture s by $A_v$, where $A_v$ is given by, $$A_v = 2F_h\ \tan\ \theta_v. \tag{3}$$

When $\theta_v$ is twice $\theta_h$, the beam size following the collimating lens is approximately s by 2s. The prisms that follow the collimating lenses are, in that case, square with each face. 2s by 2s and two laser beams are translated with each set of prisms.

In another embodiment of this invention, the focal length of the collimating lens in the vertical plane is also chosen to be s, so that the beam shape following the collimating lens is s by s, or round in a square region $s^2$. In that case the focal length in the vertical plane is, $$F_v = s/(2\ \tan\ \theta_v) \approx s/(2\ NA_v), \tag{4}$$

where $NA_v$ is the equivalent numerical aperture of the laser beam in the vertical plane. This dual focal length lens system may be accomplished by using crossed cylinder focusing elements, each having a different curvature.

Figure 6:
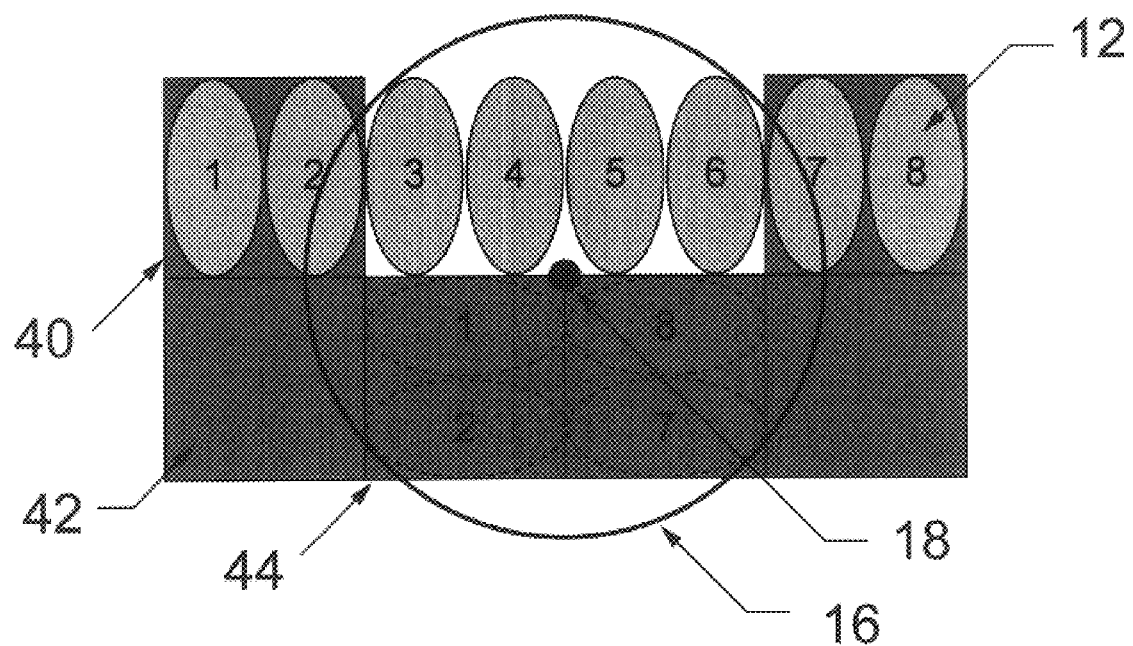
FIG. 6 is an elevational view of a pair of crossed cylindrical lenses for collimating the laser beam.

Another example of the translation of beams is shown in the FIG. 6, which is an end view of FIG. 1. Here, the laser facets 12 are labeled 1–8 so that their ending position relative to their starting position can be represented. An outline of the focusing lens 16, the array of collimating lenses 12 and the fiber 18 are also shown. As can be seen, only beams output by the outer laser facets, e.g., 1, 2, 7 and 8, will be incident upon the prisms, configured as shown in FIG. 4. As can be seen in FIG. 6, the outer laser beams are translated so that they are rotated and positioned under the center beams, providing a more circular beam.

Figure 7A:
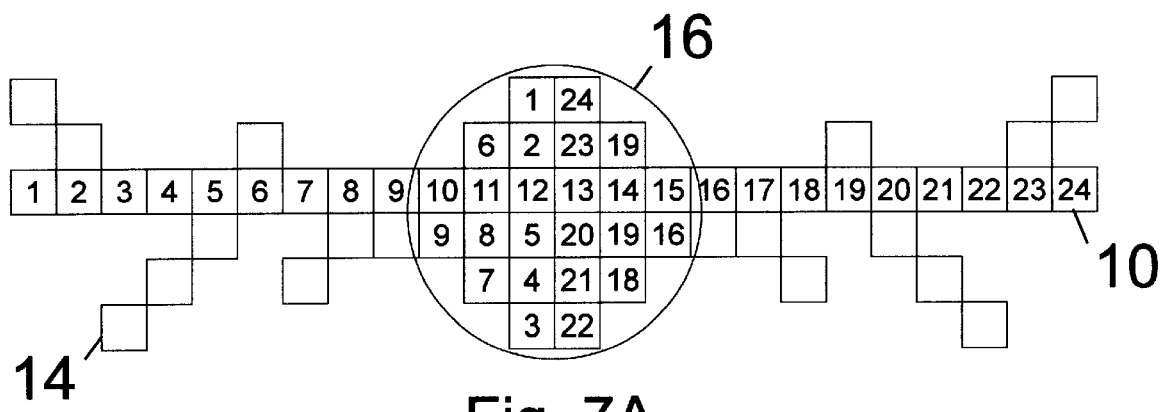
FIGS. 7a–7c are schematic end view, top view, and side view of a plurality of lasers using right angle prism in accordance with the present invention.
Figure 7B:
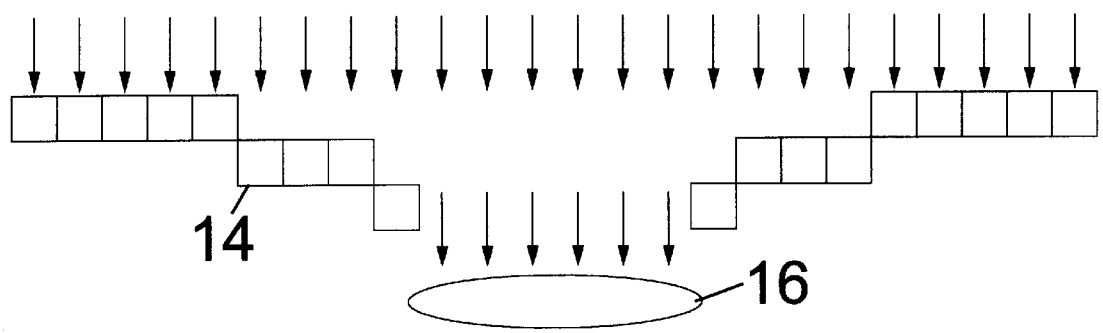
Figure 7C:
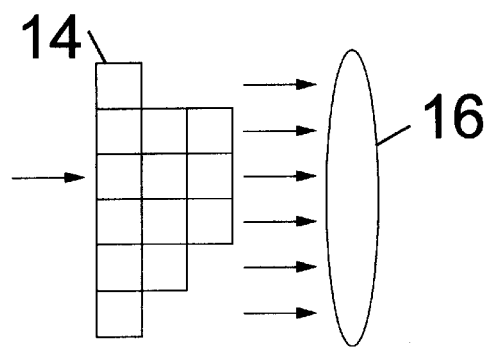

As can be seen in a more complex example of FIGS. 7A–7C, a number of prisms or reflective surfaces may be used to translate a larger linear array into a desired shape, here circular. In the end view of FIG. 7A, the original positions of the lasers along the linear area 10 are indicated, as well as the final positions of the beams within the outline of the focusing lens 16. FIG. 7B is a top view of this prism arrangement and FIG. 7C is a side view of the same prism arrangement. Again, the width of the central collection of laser beams, i.e., those beams that are not translated by the prisms 14, define the largest dimension of the resultant beam.

Thus, in all of the above configurations, light from the small laser facets from all the lasers in the array is collimated. The outer beams are translated laterally by right angle reflections from the sets of prisms but remain collimated. The focusing lens images the laser facets on the plane of the fiber face. This optical configuration is a re-imaging system. The size of the facets on the fiber face is a function of the optical magnification, which is determined by the ratio of the focal length of the focusing lens to the focal length of the collimating lens. When the focal lengths differ in the orthogonal planes, then the magnification differs in those planes. In that case, the rectangular laser facets will have a different aspect ratio when reimaged on the plane of the fiber face.

If the laser facets have dimensions $I_h$ by $I_v$, where the subscript h stands for horizontal plane and v stands for the vertical plane dimensions, then the size of the facet at the fiber face is, $$\text{image of laser facet} = M_h I_h\ \text{by}\ M_v I_v, \tag{5}$$

where the magnifications are given by, $$M_h = F_{focusing}/F_h = D\ NA_h/(s\ NA_{fiber}), \tag{6}$$

$$M_v = F_{focusing}/F_v = D\ NA_v/(s\ NA_{fiber}). \tag{7}$$

When the diagonal of this rectangular region is less than the diameter of the fiber core, then essentially all of the laser power is transmitted to the fiber. The condition for 100% coupling is, $$\text{Fiber Diameter} = D_{fiber} \geq [(M_h I_h)^2 + (M_v I_v)^2]^{1/2} \tag{8}$$

Thus, as can be seen from Eqs. (6–8), for small diameter fibers, such as a single mode fiber, the magnifications should be as small as possible. As noted above, since the focal length of the collimating lens is set by the separation of the laser facets, the focal length of the focusing lens must be made as small as possible.

As an example of using Eqs. (6–8), consider the case where a single focal length collimating lens is used and no prisms are used to compact the array of beams. In this case the focusing lens diameter D must fit the N lasers in the linear array, $D=N\,s$. Assuming that the laser facets are much longer than they are wide, this gives the condition, $$D_{fiber} \geq NI_h NA_{laser}/NA_{fiber} \tag{9}$$

Suppose $NA_{fiber}=0.12$, $NA_{laser}=0.24$, $D_{fiber}=8\,\mu m$, and $I_h=2\,\mu m$, then $N=2$. This means that only two lasers can be 100% coupled to the fiber. This example illustrates the advantage of grouping the laser beams into the smallest circle. Four lasers beams can be placed in a bundle with only the square root of 2 (41%) increase in diameter.

The general guidelines presented above are not universal. The expansion angles of the two perpendicular planes of the laser beam may be significantly different. This is why the selection of an appropriate lenslet array to collimate the light beams along both axes is important to realizing optimal performance. The first major source of loss in coupling the multiple wavelength beams is the inability of the collimating lens to capture all of the light. If a round-aperture collimating lens designed to capture all the light in the horizontal plane is used, then some power is lost when light in the vertical plane expands faster and spills over the collimating lens.

Figure 8A:
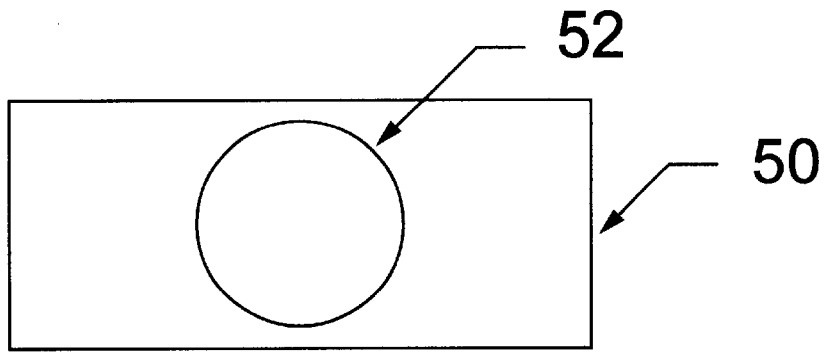
FIGS. 8a–8c are schematic end views illustrating various degrees of fill of the fiber.

The second major source of loss results when the image of the laser facet is larger than the fiber core. Assuming the energy density across the laser facet is uniform, then the fraction of power transferred would be the ratio of the area of the fiber that falls in the image of the facet to the area of the facet. To understand this, assume that a fiber core 52 falls entirely within an image of the facet 50, as shown in FIG. 8A. The fraction of power P transferred is, assuming uniform power distribution over the image, $$P=\pi D_{fiber}^2/[4(M_h I_h)(M_v I_v)]. \tag{10}$$

This expression assumes a uniform distribution of power across the image of the laser facet. A more realistic assumption is that it is Gaussian with $1/e^2$ points at the calculated edges of the image. This increases the power over the uniform assumption because most of the power is in the center of the image. All images of the N laser facets come to focus with the same magnification at the fiber face. Thus, this system produces a uniform combining of all the laser outputs, with essentially the same loss for each of them. Recall that the magnification is the ratio of the focal lengths, $$M_h = F_{focusing}/F_h = D\,NA_h(s\,NA_{fiber}),$$

$$M_v = F_{focusing}/F_v = D\,NA_v(s\,NA_{fiber}), \tag{11}$$

where we have assumed the collimated beam is round. Equation (10) then becomes, $$P=\pi s^2 NA_{fiber}^2 D_{fiber}^2/[4D^2 I_h NA_h I_v NA_v]. \tag{12}$$

For a large number N of laser beams each occupying a square aperture of side s, the number of beams that can fit into the aperture of the focusing lens of diameter D, is given by, $$N=\pi D^2/(4s^2). \tag{13}$$

In this large N case, the fractional power coupled to the fiber is, $$P=\pi s^2 NA_{fiber}^2 D_{fiber}^2/[16N\,I_h NA_h I_v NA_v]. \tag{14}$$

This indicates the power coupled to the fiber decreases with N for large N for fixed laser and fiber parameters. Considering a laser facet size of 0.7 $\mu$m by 2 $\mu$m and beam expansion angles $NA_h=0.77$ and $NA_v=0.43$, and a fiber diameter of 8.3 $\mu$m and $NA_{fiber}=0.12$, the fractional power P in the large N case is, $$P=1.31/N. \tag{15}$$

The value of the 1.31 coefficient is significant. With this invention, for large N, for a given laser and fiber, 30% more power can be transferred to a single mode fiber than with couplers using beamsplitters, which can do no better than 1/N for any N large or small.

Figure 8B:
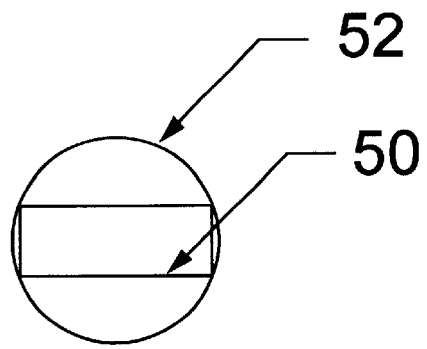

Consider now the case where the image of the laser facet 50 lies entirely within the fiber core face 52. This is shown in FIG. 8B. This produces 100% coupling of the lasers to the fiber. The condition for this to occur is that the diameter of the fiber core must be equal to or greater than the diagonal of the image of the laser facet, $$D_{fiber}^2 \geq (M_h I_h)^2 + (M_v I_v)^2. \tag{16}$$

Using expressions for the magnifications given above, the condition for 100% coupling becomes, $$D_{fiber}^2 \geq D^2[(I_h NA_h)^2 + (I_v NA_v)^2]/(s\,NA_{fiber})^2. \tag{17}$$

Using the same laser and fiber parameters used above, this equation is, $$68.8 \geq 71.5 D^2/s^2. \tag{18}$$

Consider the case for one laser. By selecting $D=s$, Eq.(18) is very nearly satisfied. This means essentially all the power of a single laser will couple into a single mode fiber, especially when taking into account that the energy density falls off near the edges of the facet image.

As a second example, consider a laser with facet size 0.7 $\mu$m by 3 $\mu$m having expansion angle given by $NA_h=0.25$ and $NA_v=0.12$, and a fiber diameter of 8.3 $\mu$m and $NA_{fiber}=0.12$. In this case, the laser is not expanding as fast as the first example above. The large N fractional power coupled is $9.71/N$ and condition for 100% coupling is $68.8 \geq 11.1 D^2/s^2$. This shows a significant advantage over beamsplitter coupling for large N. It also shows that given N beams in a row (without compaction) N s=D, that 2.49 lasers can have 100% coupling.

Figure 8C:
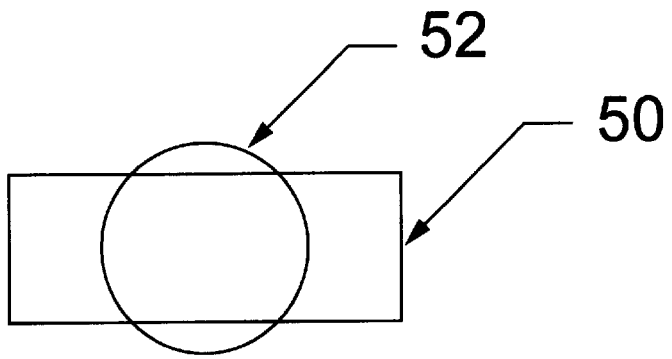

The fractional power coupled in cases other than large N or 100% coupling must be calculated by integration. In that case the outline of the fiber core 52 circle falls partly in and partly out of the outline of the image of the laser facet 52, as shown in FIG. 8C. For greater accuracy, a Gaussian beam profile across the image of the laser facet is assumed.

Another embodiment of this invention uses polarization coupling to double the number of lasers beams being coupled to a single fiber when the lasers are initially polarized. One method for polarization coupling consists of combining N laser beams into a compact composite beam as described above, and combining another N laser beams into another compact composite beam as described above, and then inserting into one of the composite beams a half-wave plate, or other means, to rotate the state of polarization by 90°. These two composite beams are then combined by the use of a polarizing beam splitter. The output beam from the polarizing beam splitter is the same size as each input beam to the polarizing beam splitter. The output beam from the polarizing beam splitter is then focused down to the fiber with the focusing lens described above.

Thus, the passive optical system in accordance with the present invention allows coupling of multi wavelength light from an array of lasers to an output port, preferably a single mode fiber. The passive optical system in accordance with the present invention operates when any laser is on alone at any fixed or multiple wavelengths. The passive optical system also operates when any or all light sources in an array are on simultaneously operating at any wavelength. In other words, the passive optical system of the present invention is wavelength insensitive and allows for efficient coupling from an array of light sources into even a single mode fiber.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

What is claimed is:

1. A method for combining power from an array of light sources, the array of light sources extending predominately in one direction, at least one light source of the array of light sources sequentially outputting light at more than one wavelength, into an output port comprising:

collimating individual light beams from the array of light sources;

rearranging collimated individual light beams into a composite beam of a desired shape, the desired shape extending more equally along two directions than the array of light sources, a position of a light beam from a corresponding light source of the array of light sources in the composite beam being independent of wavelength; and focusing the composite beam onto the output port.

2. The method of claim 1, wherein the output port is a single mode fiber.

3. The method of claim 1, wherein said collimating includes providing an array of lenslets, each lenslet having an aperture matched to an aspect ratio of the individual light beams.

4. The method of claim 1, wherein said collimating includes providing crossed cylindrical lenses.

5. The method of claim 1, wherein said rearranging includes providing two surfaces each supplying a right angle reflection to light input thereto.

6. The method of claim 1, wherein said rearranging includes providing three right angle prisms.

7. The method of claim 1 wherein said focusing includes providing a lens having a numerical aperture matching a numerical aperture of the fiber.

8. The method of claim 1, wherein the fractional power entering the fiber is uniform over all the light sources.

9. The method of claim 1, further comprising, when the light sources are polarized, providing a stage of polarization coupling.

10. The method of claim 1, wherein the wavelengths of the light sources may be fixed at a single wavelength or at multiple wavelengths, or may be tunable.

11. The method of claim 1, further comprising turning on each of the array of light sources individually or turning on any number of the light sources of the array of light sources simultaneously.

12. The method of claim 1, wherein said focusing includes providing a focus lens with a focal length which is as small as possible for the desired shape and the output port.

13. The method of claim 12, wherein the output port is a single mode fiber.

14. An apparatus for combining power from an array of light sources, the array of light sources extending predominately in one direction, at least one light source of the array of light sources sequentially outputting light at more than one wavelength, into an output port comprising:

a lens array collimating light beams from the array of light sources;

a rearranging unit which repositions individual light beams from the lens array into a composite beam of a desired shape, the desired shape extending more equally along two directions than the array of light sources, a position of a light beam from a corresponding light source of the array of light sources in the composite beam being independent of wavelength; and a focus lens which focuses the composite beam onto the output port.

15. The apparatus of claim 14, wherein the output port is a single mode fiber.

16. The apparatus of claim 14, wherein each lenslet in the lens array has an aperture matched to an aspect ratio of the individual light beams.

17. The apparatus of claim 14, wherein the lens array comprises crossed cylindrical lenses.

18. The apparatus of claim 14, wherein said rearranging unit comprises two reflective surfaces supplying right angle reflections to any light impinging thereon.

19. The apparatus of claim 14, wherein said rearranging unit comprises three right angle prisms arranged to translate and shift beams incident thereon.

20. The apparatus of claim 14, wherein the focusing of the composite beam is performed with a lens having a numerical aperture matching a numerical aperture of the fiber.

21. The apparatus of claim 14, wherein the fractional power entering the fiber is uniform over all the light sources.

22. The apparatus of claim 14, further comprising, when the light sources are polarized, a stage of polarization coupling.

23. The apparatus of claim 14, wherein the wavelengths of the lasers may be fixed at a single wavelength or at multiple wavelengths, or may be tunable.

24. The apparatus of claim 14, wherein each light source of the array of light sources may be turned on individually or any number of light sources of the array of light sources may be turned on simultaneously.

25. The apparatus of claim 14, wherein said focus lens has a focal length which is as small as possible for the desired shape and the output port.

26. The apparatus of claim 25, wherein the output port is a single mode fiber.

* * * * *